(12) United States Patent
Celan et al.

(10) Patent No.: US 11,820,409 B2
(45) Date of Patent: Nov. 21, 2023

(54) METHOD FOR PRODUCING MOVEMENT INFORMATION

(71) Applicant: SIEMENS MOBILITY GMBH, Munich (DE)

(72) Inventors: Boris Celan, Braunschweig (DE); Volker Knollmann, Braunschweig (DE)

(73) Assignee: Siemens Mobility GmbH, Munich (DE)

( * ) Notice: Subject to any disclaimer, the term of this patent is extended or adjusted under 35 U.S.C. 154(b) by 474 days.

(21) Appl. No.: 17/264,931

(22) PCT Filed: Jul. 2, 2019

(86) PCT No.: PCT/EP2019/067658
§ 371 (c)(1),
(2) Date: Feb. 1, 2021

(87) PCT Pub. No.: WO2020/025239
PCT Pub. Date: Feb. 6, 2020

(65) Prior Publication Data
US 2021/0309269 A1    Oct. 7, 2021

(30) Foreign Application Priority Data
Jul. 31, 2018   (DE) ..................... 10 2018 212 768.9

(51) Int. Cl.
*G06F 17/00*   (2019.01)
*B61L 25/02*   (2006.01)
*G01R 25/00*   (2006.01)

(52) U.S. Cl.
CPC .............. *B61L 25/02* (2013.01); *G01R 25/00* (2013.01)

(58) Field of Classification Search
CPC ...... B61L 25/02; B61L 25/023; B61L 25/026; B61L 25/021; G01R 25/00
(Continued)

(56) References Cited

U.S. PATENT DOCUMENTS 3,565,216 A * 2/1971 Gohlke ..................... B66B 9/06
187/202
4,131,018 A * 12/1978 Muller .................... F16L 55/28
901/17
(Continued)

FOREIGN PATENT DOCUMENTS

DE   1107697 B    5/1961
DE   1911734 A1   10/1969
(Continued)

OTHER PUBLICATIONS

Electric locomotives and catenary power systems (Year: 2020).*
(Continued)

*Primary Examiner* — Ronnie M Mancho
(74) *Attorney, Agent, or Firm* — Laurence A. Greenberg; Werner H. Stemer; Ralph E. Locher

(57) ABSTRACT

A method produces movement information describing a movement of a vehicle. Accordingly, the vehicle is connected to a power transmission line, and at least one electrical variable relating to the power transmission line is measured, forming at least one line-based measured value, and the movement information is determined by using the at least one line-based measured value.

15 Claims, 2 Drawing Sheets

(58) Field of Classification Search
USPC .......................................................... 701/494
See application file for complete search history.

(56) References Cited

U.S. PATENT DOCUMENTS

| | | | | |
|---|---|---|---|---|
| 4,399,753 | A * | 8/1983 | Theurer | E01B 27/17 |
| | | | | 104/7.2 |
| 4,599,553 | A * | 7/1986 | Brennen | H02J 3/1842 |
| | | | | 340/657 |
| 5,381,879 | A * | 1/1995 | Takata | F16D 41/061 |
| | | | | 192/45.003 |
| 8,454,504 | B2 * | 6/2013 | Michaeli | A61B 17/0293 |
| | | | | 600/233 |
| 10,790,950 | B2 * | 9/2020 | Fischer | H04L 5/0048 |
| 10,793,006 | B2 * | 10/2020 | Kerscher | B60L 50/53 |
| 10,835,853 | B2 * | 11/2020 | Duennwald | B01D 50/20 |
| 10,836,265 | B2 * | 11/2020 | Glinka | B60T 13/586 |
| 10,836,430 | B2 * | 11/2020 | Buehs | G05D 1/0278 |
| 10,882,544 | B2 * | 1/2021 | Adomeit | B61L 3/008 |
| 10,899,373 | B2 * | 1/2021 | Adomeit | B61L 25/026 |
| 10,906,569 | B2 * | 2/2021 | Schmidt | B61G 11/16 |
| 10,906,572 | B2 * | 2/2021 | Nayak | B61L 27/70 |
| 10,933,897 | B2 * | 3/2021 | Kutschera | B61L 29/22 |
| 10,940,875 | B2 * | 3/2021 | Brueggen | B61D 17/22 |
| 10,950,071 | B2 * | 3/2021 | Ling | G07C 5/085 |
| 10,981,582 | B2 * | 4/2021 | Kroiss | B61D 17/02 |
| 10,994,751 | B2 * | 5/2021 | Kroiss | B61D 17/02 |
| 11,021,174 | B2 * | 6/2021 | Grzona | B61D 17/02 |
| 11,124,167 | B2 * | 9/2021 | Kluth | B60T 15/302 |
| 11,124,212 | B2 * | 9/2021 | Moennich | B61L 23/042 |
| 11,124,213 | B2 * | 9/2021 | Schmidt | B61L 29/22 |
| 11,130,505 | B2 * | 9/2021 | Bauer | B61D 29/00 |
| 11,156,649 | B2 * | 10/2021 | Dahms | G01R 31/008 |
| 11,193,814 | B2 * | 12/2021 | Salzgeber | G01L 5/0052 |
| 11,214,283 | B2 * | 1/2022 | Proell | B61C 17/02 |
| 11,292,496 | B2 * | 4/2022 | Okyere | H02J 1/00 |
| 11,318,971 | B2 * | 5/2022 | Guislain | B61L 21/10 |
| 11,465,658 | B2 * | 10/2022 | Braband | B61L 27/16 |
| 11,479,277 | B2 * | 10/2022 | Wennekamp | B61F 15/20 |
| 11,679,792 | B2 * | 6/2023 | Ersch | B61L 27/53 |
| | | | | 246/120 |

FOREIGN PATENT DOCUMENTS

| | | |
|---|---|---|
| DE | 102014217194 A1 | 3/2016 |
| DE | 102014218671 A1 | 3/2016 |
| RU | 2654958 C1 | 5/2018 |

OTHER PUBLICATIONS

"MOHR Application Note: TDR vs. FDR: Distance-to-Fault", 2010, Mohr and Associates.

Furse C et al: "Noise-Domain Reflectometry for Locating Wiring Faults", IEEE Transactions on Electromagnetic Compatibility, IEEE Service Center, New York, NY, US, vol. 47, No. 1, pp. 97-104, XP011127068, ISSN: 0018-9375, DOI: 10.1109/TEMC.2004. 842109, mentioned in the application; Abstract; Capture I. and VI.; 2005.

M. Zajc, et al. "High Voltage Power Line Constraints for High Speed Communications", Laboratory for digital signal, image and video processing; Faculty of electrical engineering, University of Ljubljana, Slovenia.

* cited by examiner

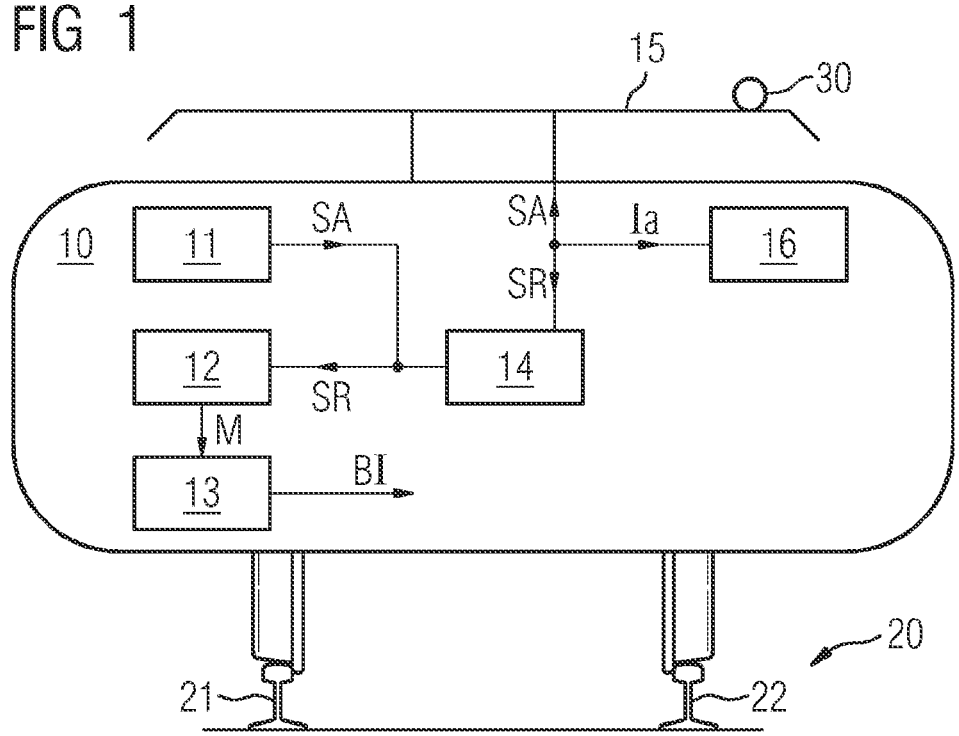
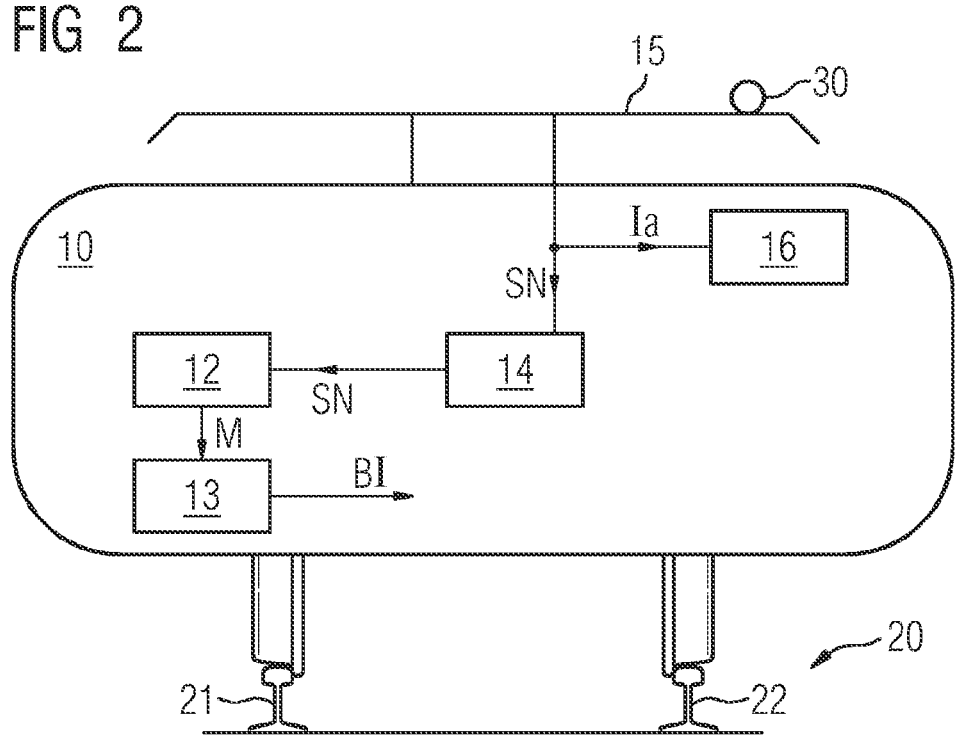

METHOD FOR PRODUCING MOVEMENT INFORMATION

BACKGROUND OF THE INVENTION

Field of the Invention

The invention relates to a method for producing movement information describing a movement of a vehicle. Methods for measuring movements of a vehicle can, as is known, be based on different technical methods, for example on satellite locating methods, radar, and the detection of revolutions of wheels, etc.

SUMMARY OF THE INVENTION

The invention is based on the object of specifying a method for producing movement information which provides particularly precise measurement results with little expenditure.

This object is achieved according to the invention by means of a method having the features as claimed in the independent patent claim. Advantageous refinements of the method according to the invention are specified in dependent claims.

Accordingly, the invention provides that the vehicle is connected to a power transmission line, and at least one electrical variable which relates to the power transmission line is measured, forming at least one line-based measured value, and the movement information is ascertained using the at least one line-based measured value.

A significant advantage of the method according to the invention is that only electrical measured values which are generally present in any case in an electrically driven vehicle or a vehicle which is connected to a power transmission line have to be used to produce the movement information. The method can therefore be carried out with very few components.

In one method variant which is considered advantageous there is provision that the vehicle has an electric drive which is connected to the power transmission line and is supplied by the latter with drive current.

The measurement of the electrical variable is preferably carried out at the vehicle end during travel.

In a first particularly preferred refinement of the method there is provision that at the vehicle end, an electrical excitation signal is respectively fed repeatedly into the power transmission line using a transmitter device, the time period between the feeding in of the respective excitation signal and the measurement of reflected signal components is respectively detected for each excitation signal, and the movement information is ascertained on the basis of the change in the time periods between the feeding in of the excitation signals and the measurement of the reflected signal components.

Alternatively or additionally, there can be advantageously provision that the electrical variable is measured over time by forming a measured value progression, an auto-correlation function is calculated with the measured value progression, the distance from at least one reflection point on the power transmission line is determined on the basis of the auto-correlation function, during travel, the change in the distance between the vehicle and the at least one reflection point is ascertained, and the movement information is ascertained on the basis of the change in the distance.

The vehicle is preferably a track-bound vehicle or a vehicle which follows a predefined track. The vehicle is particularly preferably a rail vehicle, in particular a railroad vehicle.

The angle between the longitudinal direction of the track and the longitudinal direction of the power transmission line is preferably taken into account in the ascertaining the movement information.

With respect to the last-mentioned aspect it is considered advantageous if the line-based measured value is converted into a route-based measured value by multiplication by a correction value, according to $$ML = MS * \cos \varphi$$

where ML denotes the line-based measured value, MS denotes the route-based measured value and $\varphi$ denotes the angle between the direction of the track and the direction of the power transmission line, and the movement information is ascertained taking into account the route-based measured value.

Preferably the voltage which is present on the power transmission line is measured as an electric variable, and/or the current flowing through the power transmission line is measured as an electrical variable, and/or the phase angle between the voltage at the vehicle and the current flowing into the vehicle or out of the vehicle is measured as an electrical variable.

Particularly preferably, at least the current flowing into the vehicle or out of the vehicle via a vehicle-end current collector is measured as an electrical variable.

Preferably a change in the location of the vehicle and/or the speed of the vehicle and/or the acceleration of the vehicle are/is measured as movement information.

The invention also relates to a vehicle having an interface to a route-end power transmission line.

According to the invention, there is provision with respect to such a vehicle that the vehicle has a measuring device for measuring at least one electrical variable relating to the power transmission line, by forming at least one line-based measured value, and the vehicle has an evaluation device which ascertains the movement information using the at least one line-based measured value.

With respect to the advantages of the vehicle according to the invention, reference is made to the above statements relating to the method according to the invention.

The invention is explained in more detail below on the basis of exemplary embodiments.

BRIEF DESCRIPTION OF THE SEVERAL VIEWS OF THE DRAWING

FIG. 1 shows by way of example a cross-sectional view of a first exemplary embodiment of a vehicle according to the invention, on the basis of which, for example, an exemplary embodiment of the method according to the invention is explained, FIG. 2 shows by way of example a second exemplary embodiment of a vehicle according to the invention on the basis of which a second exemplary embodiment of the method according to the invention is explained.

DETAILED DESCRIPTION OF THE INVENTION

Figure 3:
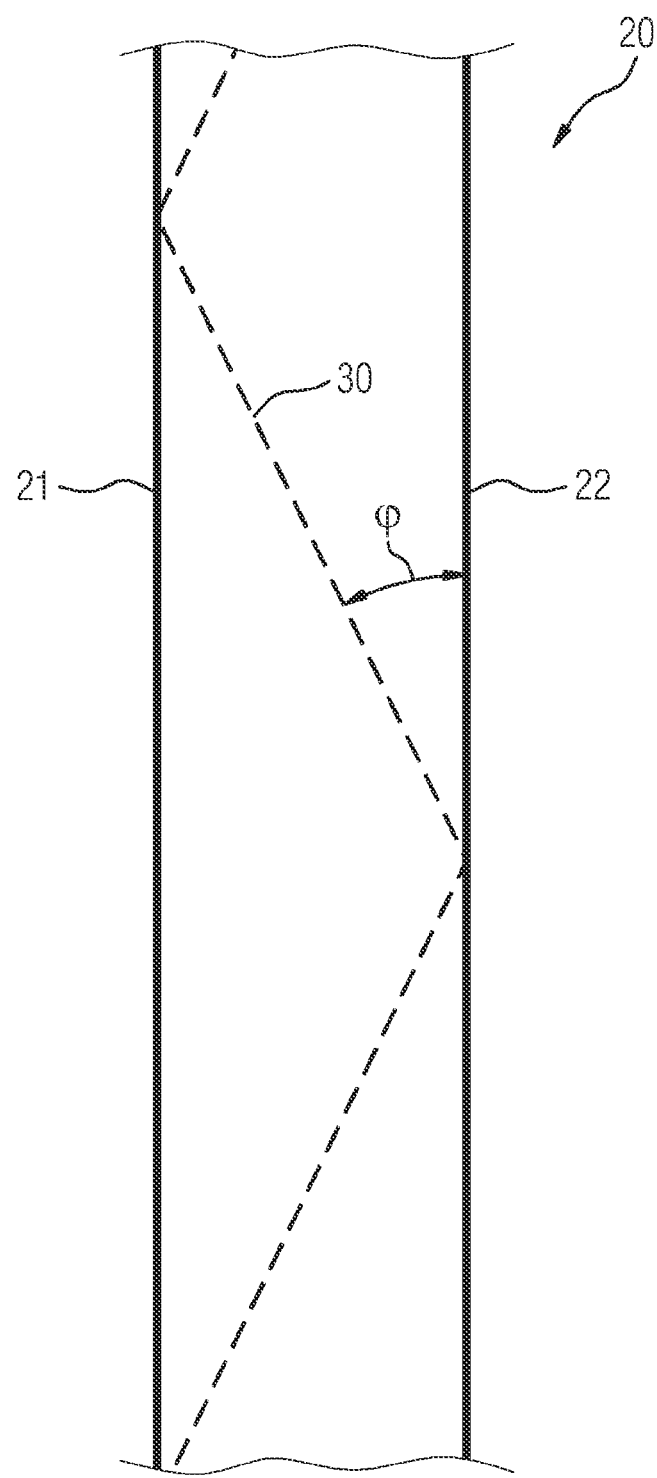
FIG. 3 shows by way of example a plan view of a railroad track system in order to provide an exemplary explanation of a means of forming correction values for ascertaining a route-based measured value on the basis of a line-based measured value.

In the figures, the same reference symbols are always used for identical or comparable components for the sake of clarity.

FIG. 1 shows a cross-sectional view of a rail vehicle 10 which is traveling along a railroad track system 20. Rails of the railroad track system 20 are characterized by the reference symbols 21 and 22 in FIG. 1.

The rail vehicle 10 has a transmitter device 11, a measuring device 12 and an evaluation device 13. The transmitter device 11 and the measuring device 12 are connected to a current collector 15 of the rail vehicle 10, preferably via a coupling device 14. The current collector 15 is in electrical contact with a power transmission line 30. During travel, a drive 16 of the rail vehicle 10 can be supplied with a drive current Ia via the current collector 15; and furthermore, further components of the rail vehicle 10 can be supplied with current via the current collector 15. When the rail vehicle 10 brakes, braking current can also be fed into the power transmission line 30 via the current collector 15.

In order to form movement information BI describing the movement of the rail vehicle 10, the transmitter device 11, the measuring device 12 and the evaluation device 13 preferably operate as follows:

The transmitter device 11 generates an excitation signal SA which it feeds into the power transmission line 30 via the coupling device 14 and the current collector 15. The feeding in of the excitation signal SA is preferably carried out repeatedly, for example at regular intervals.

The excitation signal SA is transmitted via the power transmission line 30 and entirely or partially reflected at interference points or points with a change in electrical impedance. The reflected signal components pass in the form of a reflection signal SR to the measuring device 12 via the coupling device 14.

The measuring device 12 measures at least one electrical variable relating to the power transmission line 30, said variable being, for example, the voltage which is present at the current collector 15, the current flowing through the current collector 15, or the phase angle between the current flowing through the current collector 15 and the voltage which is present at the current collector 15. The reflection signal SR and/or the reflected signal components of the excitation signal SA are therefore detected by the measuring device 12, which outputs a line-based measured value M at the output end.

The line-based measured value M is evaluated by the evaluation device 13, wherein the movement information BI which specifies the movement of the rail vehicle 10 is formed.

For example, the evaluation device 13 can respectively detect the time period between the feeding in of the respective excitation signal SA and the measurement of the reflected signal component or components or of the reflection signal SR, and ascertain the movement information BI on the basis of the change in the time periods between the feeding in of the excitation signals SA and the measurement of the reflection signal SR during travel. If, for example, the rail vehicle 10 travels to a point of change in the impedance or a reflection point of the power transmission line 30, the time period between the feeding in of the excitation signals SA and the measurement of the corresponding, reflected signal components during travel becomes shorter, whereas in the opposite direction of travel the time periods will increase. The excitation signal SA preferably has a frequency or a frequency spectrum for which the coupling device 14 has low impedance. The frequency or frequencies of the frequency spectrum of the excitation signal SA preferably differ from the power grid frequency of the power grid voltage which is present at the power transmission line 30.

On the basis of the measured time period it is therefore possible to determine a change in the location of the vehicle as movement information BI. As is known, the vehicle speed or else the vehicle acceleration can be derived on the basis of the change in the location of the vehicle, and corresponding movement information BI relating to the vehicle speed and/or the vehicle acceleration can be output.

Measurements for the determination of the location of line faults on a power transmission line or of points of changes in impedance on a power transmission line are generally known in the field of power transmission technology, in order to determine the location of faults on lines; for the method described above it is therefore possible to access known measuring methods and measuring devices in this technical area (cf. e.g. the publications "High Voltage Power Line Constraints for High Speed Communications" (M. Zajic et al., Laboratory for Digital Signal, Image and Video Processing; Faculty of Electrical Engineering, University of Ljubljana, Slovenia) and "MOHR Application Note: TDR vs. FDR: Distance-to-Fault" (2010, Mohr and Associates)).

FIG. 2 shows a second exemplary embodiment of a rail vehicle 10 which is equipped with a measuring device 12 and an evaluation device 13. The measuring device 12 is connected to a current collector 15 of the rail vehicle 10 via a coupling device 14. In contrast to the exemplary embodiment according to FIG. 1, in the exemplary embodiment according to FIG. 2 a transmitter device 11 for generating an excitation signal SA is not present.

At the rail vehicle 10 according to FIG. 2, movement information BI is produced solely on the basis of the measurement of a noise signal SN, which passes to the measuring device 12 via the current collector 15 and the coupling device 14 and is measured by the latter as a line-based measured value M. The noise signal SN can relate to any electrical variable, for example to the voltage which is present on the power transmission line 30, to the current flowing through the power transmission line 30 or to the phase angle between the voltage at the vehicle and the current flowing into the vehicle or out of the vehicle.

The evaluation device 13 detects the noise signal SN over time by forming a measured value progression with which an auto-correlation function is subsequently calculated. The evaluation device 30 can determine the distance from at least one reflection point on the power transmission line 30 on the basis of the auto-correlation function. With respect to ascertaining reflection points on a power transmission line on the basis of a noise signal SN, reference is made by way of example to the document "Noise-Domain Reflectometry for Locating Wiring Faults" (Chet Lo, Member and Cynthia Furse, IEEE Transactions on Electromagnetic Compatibility, vol. 47, No. 1, February 2005, pages 97 to 104), in which a corresponding location determining method is described in detail.

During the travel of the rail vehicle 10, the distance between the rail vehicle 10 and the reflection point or points on the power transmission line 30 will change so that the movement information BI can be produced on the basis of the change in the distance. The movement information BI can in turn be the specification of a change in the location of the vehicle, the specification of a vehicle speed and/or the specification of the respective vehicle acceleration.

The movement information BI which is obtained by the evaluation device 13 relates to the power transmission line 30. If the power transmission line 30 is not oriented parallel to the rails 21 and 22 of the track system 20 but rather zigzag shaped, as shown in FIG. 3, it is advantageous to convert the line-based measured value M into a route-based measured value by multiplication by a correction value, according to $$ML = MS * \cos \varphi$$

where ML denotes the line-based measured value, MS denotes the route-based measured value and φ denotes the angle between the direction of the track or the rails 21 and 22 and the direction of the power transmission line 30, and the movement information BI is acquired taking into account the route-based measured value.

After the calculation or correction, the movement information BI relates to the route and no longer to the power transmission line 30, as is the case without correction.

Even though the invention has been illustrated and described in more detail through preferred exemplary embodiments, the invention is not limited to the disclosed examples and other variations can be derived therefrom by a person skilled in the art without departing from the scope of protection of the invention.

The invention claimed is:

1. A method for producing movement information describing a movement of a vehicle, which comprises the steps of:
    connecting the vehicle to a power transmission line;
    measuring at least one electrical variable relating to the power transmission line, and forming at least one line-based measured value; and
    ascertaining the movement information using the at least one line-based measured value.

2. The method according to claim 1, wherein the vehicle has an electric drive which is connected to the power transmission line and is supplied by the power transmission line with drive current.

3. The method according to claim 1, which further comprises carrying out the measuring of the at least one electrical variable at a vehicle end during travel.

4. The method according to claim 1, which further comprises:
    repeatedly feeding in an electrical excitation signal into the power transmission line using a transmitter device, at a vehicle end;
    detecting a time period between the feeding in of the electrical excitation signal and a measurement of reflected signal components for each said electrical excitation signal; and
    ascertaining the movement information on a basis of a change in time periods between the feeding in of excitation signals and the measurement of the reflected signal components.

5. The method according to claim 1, which further comprises:
    measuring the at least one electrical variable over time by forming a measured value progression;
    calculating an auto-correlation function with the measured value progression;
    determining a distance from at least one reflection point on the power transmission line on a basis of the auto-correlation function;
    during travel, ascertaining a change in a distance between the vehicle and the at least one reflection point; and
    ascertaining the movement information on a basis of the change in the distance.

6. The method according to claim 1, wherein:
    the vehicle is a track-bound vehicle or a vehicle which follows a predefined track; and
    an angle between a longitudinal direction of the predefined track and a longitudinal direction of the power-transmission line is taken into account in the ascertaining of the movement information.

7. The method according to claim 6, which further comprises converting the at least one line-based measured value into a route-based measured value by multiplication by a correction value, according to $$ML = MS * \cos \varphi$$

where ML denotes the at least one line-based measured value, MS denotes the route-based measured value and cp denotes an angle between a direction of the predefined track and a direction of the power-transmission line, and the movement information is ascertained taking into account the route-based measured value.

8. The method according to claim 1, wherein a voltage which is present on the power transmission line is measured as the at least one electric variable.

9. The method according to claim 1, which further comprises measuring a current flowing through the power transmission line as the at least one electrical variable.

10. The method according to claim 1, which further comprises measuring a phase angle between a voltage at the vehicle and a current flowing into the vehicle or out of the vehicle as the at least one electrical variable.

11. The method according to claim 1, which further comprises measuring a current flowing into the vehicle or out of the vehicle via a vehicle-end current collector as the at least one electrical variable.

12. The method according to claim 1, wherein a change in a location of the vehicle is measured as the movement information.

13. The method according to claim 1, which further comprises measuring a vehicle speed as the movement information.

14. The method according to claim 1, which further comprises measuring a vehicle acceleration as the movement information.

15. A vehicle, comprising:
    an interface to a route-end power transmission line;
    a measuring device for measuring at least one electrical variable relating to the power transmission line, by forming at least one line-based measured value; and
    an evaluation device for ascertaining movement information using the at least one line-based measured value.

* * * * *